(12) United States Patent
Wang et al.

(10) Patent No.: US 10,897,020 B2
(45) Date of Patent: Jan. 19, 2021

(54) FLEXIBLE AND FOLDABLE OLED DISPLAY DEVICE

(71) Applicant: Wuhan China Star Optoelectronics Semiconductor Display Technology Co., Ltd., Wuhan (CN)

(72) Inventors: Lei Wang, Wuhan (CN); Shoucheng Wang, Wuhan (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 16/603,259

(22) PCT Filed: Mar. 21, 2019

(86) PCT No.: PCT/CN2019/078991
§ 371 (c)(1),
(2) Date: Oct. 7, 2019

(87) PCT Pub. No.: WO2020/118959
PCT Pub. Date: Jun. 18, 2020

(65) Prior Publication Data
US 2020/0235322 A1    Jul. 23, 2020

(51) Int. Cl.
*H01L 51/00* (2006.01)
*H01L 27/32* (2006.01)

(52) U.S. Cl.
CPC ...... *H01L 51/0097* (2013.01); *H01L 27/3244* (2013.01); *H01L 2251/5338* (2013.01)

(58) Field of Classification Search
CPC .................. H01L 51/0097; H01L 2251/5338
See application file for complete search history.

(56) References Cited

U.S. PATENT DOCUMENTS

| | | | |
|---|---|---|---|
| 2014/0145161 A1* | 5/2014 | Naijo | H01L 51/0097 257/40 |
| 2017/0090266 A1 | 3/2017 | Wang | |
| 2018/0219162 A1 | 8/2018 | Tang | |
| 2018/0286930 A1 | 10/2018 | Gai et al. | |

FOREIGN PATENT DOCUMENTS

| | | |
|---|---|---|
| CN | 105118400 | 12/2015 |
| CN | 106024839 | 10/2016 |
| CN | 106057821 | 10/2016 |
| CN | 106952936 | 7/2017 |

* cited by examiner

*Primary Examiner* — Daniel P Shook

(57) ABSTRACT

The present invention provides a flexible and foldable organic light-emitting diode (OLED) display device. When the flexible and foldable OLED display device is bent inward, information displayed on an organic light-emitting layer can be directly viewed through a substrate and a drive layer, without extending the flexible and foldable OLED display device, thereby improving usability of the flexible and foldable OLED display device. In addition, display areas at different positions and having different shapes are designed, so that the flexible and foldable OLED display device has more diversified appearances and functions.

16 Claims, 3 Drawing Sheets

FLEXIBLE AND FOLDABLE OLED DISPLAY DEVICE

RELATED APPLICATIONS

This application is a National Phase of PCT Patent Application No. PCT/CN2019/078991 having International filing date of Mar. 21, 2019, which claims the benefit of priority of Chinese Patent Application No. 201811527313.7 filed on Dec. 13, 2018. The contents of the above applications are all incorporated by reference as if fully set forth herein in their entirety.

FIELD AND BACKGROUND OF THE INVENTION

The present invention relates to the field of display devices, and in particular, to a flexible and foldable organic light-emitting diode (OLED) display device.

An organic light-emitting diode (OLED) has advantages of being self-illumination, light and thin and foldable, wide color gamut, and high contrast, and has attracted the widespread attention in the industry in the application fields of display, lighting, and the like.

Flexible and foldable characteristics are important features distinguishing an OLED display device from a liquid crystal display (LCD) device. An appearance of the flexible and foldable OLED display device can be designed very freely, thereby extending a use scenario of the display device and improving portability of the display device. FIG. 1A is a schematic structural view of a current flexible and foldable OLED display device being folded. Referring to FIG. 1A, the flexible and foldable OLED display device includes a substrate 10, a drive layer 11 disposed on the substrate 10, and an OLED light-emitting layer 12 disposed on the drive layer 11.

FIG. 1B is a schematic structural view of a current flexible and foldable OLED display device being folded. Referring to FIG. 1B, when the OLED display device is bent inward, the OLED light-emitting layer 12 is located inside, and the drive layer 11 and the substrate 10 are located outside. Consequently, the OLED light-emitting layer 12 is blocked by the drive layer 11 and the substrate 10, and information displayed on the OLED light-emitting layer 12 cannot be observed by others.

SUMMARY OF THE INVENTION

A technical problem to be solved by the present invention is to provide a flexible and foldable organic light emitting diode (OLED) display device capable of viewing information displayed on an organic light-emitting layer, without extending the flexible and foldable OLED display device.

To solve the foregoing problem, the present invention provides a flexible and foldable OLED display device, including a flexible substrate, a drive layer, and an organic light-emitting layer. The drive layer is disposed on the flexible substrate. The organic light-emitting layer is disposed on the drive layer. The flexible substrate has a first transparent area. The drive layer has a second transparent area. An overlapping area is defined between an orthographic projection of the first transparent area and an orthographic projection of the second transparent area in a direction perpendicular to the organic light-emitting layer. The overlapping area on one side of the flexible substrate away from the organic light-emitting layer functions as a display area. The drive layer further includes a non-transparent area. A ratio of an area of a drive circuit in the second transparent area to an area of the organic light-emitting layer is less than a ratio of an area of a drive circuit in the non-transparent area to the area of the organic light-emitting layer. One end of the non-transparent area is provided with a groove recessed toward a center of the non-transparent area. The second transparent area is disposed in the groove.

In an embodiment, the flexible substrate is a transparent flexible substrate.

In an embodiment, the overlapping area is disposed corresponding to a bending area of the flexible and foldable OLED display device.

In an embodiment, the first transparent area and the second transparent area completely overlap with each other.

In an embodiment, the first transparent area partially overlaps the second transparent area.

In an embodiment, the drive layer is a thin film transistor layer including a plurality of thin film transistors.

To solve the foregoing problem, the present invention further provides a flexible and foldable OLED display device, including a flexible substrate, a drive layer, and an organic light-emitting layer. The drive layer is disposed on the flexible substrate. The organic light-emitting layer is disposed on the drive layer. The flexible substrate has a first transparent area. The drive layer has a second transparent area. An overlapping area is defined between an orthographic projection of the first transparent area and an orthographic projection of the second transparent area in a direction perpendicular to the organic light-emitting layer. The overlapping area on one side of the flexible substrate away from the organic light-emitting layer functions as a display area.

In an embodiment, the flexible substrate is a transparent flexible substrate.

In an embodiment, the drive layer further includes a non-transparent area. The second transparent area is disposed on one end of the non-transparent area.

In an embodiment, one end of the non-transparent area is provided with a groove recessed toward a center of the non-transparent area. The second transparent area is disposed in the groove.

In an embodiment, the drive layer further includes a non-transparent area. The non-transparent area surrounds the second transparent area.

In an embodiment, the drive layer further includes a non-transparent area. A ratio of an area of a drive circuit in the second transparent area to an area of the organic light-emitting layer is less than a ratio of an area of a drive circuit in the non-transparent area to the area of the organic light-emitting layer.

In an embodiment, the overlapping area is disposed corresponding to a bending area of the flexible and foldable OLED display device.

In an embodiment, the first transparent area and the second transparent area completely overlap with each other.

In an embodiment, the first transparent area partially overlaps the second transparent area.

In an embodiment, the drive layer is a thin film transistor layer including a plurality of thin film transistors.

The present invention has advantages as follows: when the flexible and foldable OLED display device is bent inward, information displayed on an organic light-emitting layer can be directly viewed through a substrate and a drive layer, without extending the flexible and foldable OLED display device, thereby improving usability of the flexible and foldable OLED display device. In addition, by designing display areas being located at different positions and having different shapes, the flexible and foldable OLED display device can be more diverse in appearance and function.

DESCRIPTION OF SPECIFIC EMBODIMENTS OF THE INVENTION

Specific implementations of a flexible and foldable organic light emitting diode (OLED) display device provided in the present invention are described in detail below with reference to the accompanying drawings.

Figure 1A:
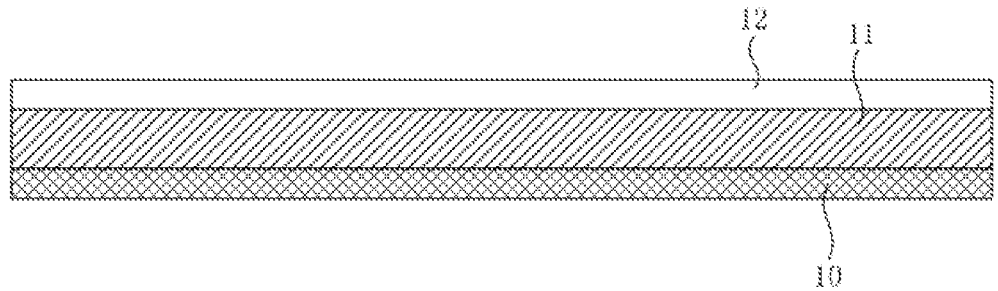
FIG. 1A is a schematic structural view of a current flexible and foldable OLED display device being folded.
Figure 1B:
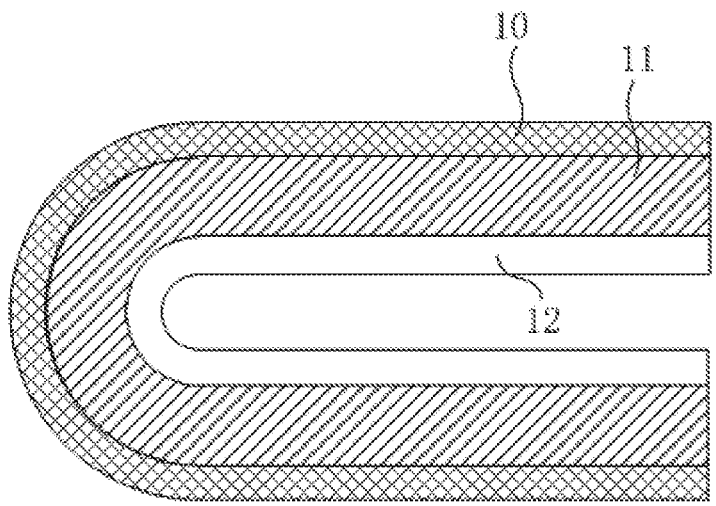
FIG. 1B is a schematic structural view of a current flexible and foldable OLED display device being folded.
Figure 2:
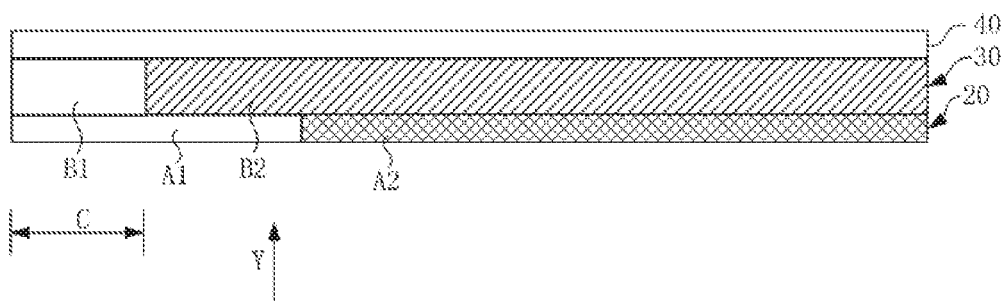
FIG. 2 is a schematic side structural view of a first embodiment of a flexible and foldable OLED display device according to the present invention.
Figure 3:
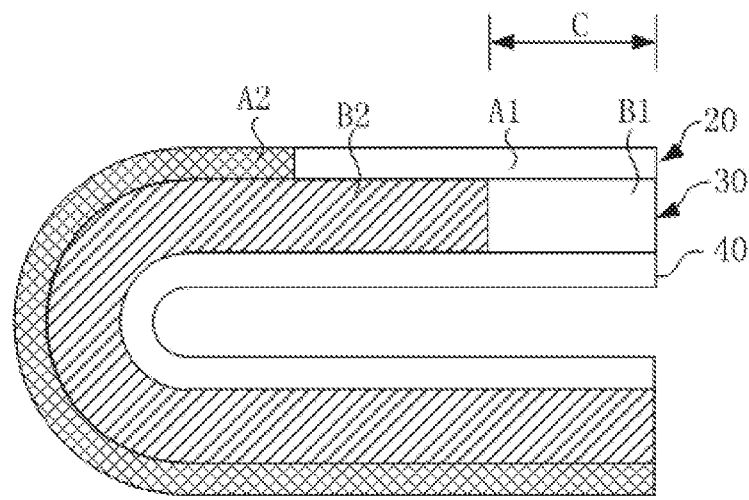
FIG. 3 is a schematic view of the flexible and foldable OLED display device shown in FIG. 2 being folded.

FIG. 2 is a schematic side structural view of a first embodiment of a flexible and foldable OLED display device according to the present invention. FIG. 3 is a schematic view of the flexible and foldable OLED display device shown in FIG. 2 being folded. Referring to FIG. 2 and FIG. 3, the flexible and foldable OLED display device in the present invention includes a flexible substrate 20, a drive layer 30, and an organic light-emitting layer 40. The drive layer 30 is disposed on the flexible substrate 20. The organic light-emitting layer 40 is disposed on the drive layer 30.

The flexible substrate 20 is made of a flexible material such as polyimide (PI). The flexible substrate 20 has a first transparent area A1. In the first transparent area A1, a structure located on another surface of the flexible substrate 20 can be observed through the flexible substrate 20. That is, in the first transparent area A1, light emitted by the structure located on the another surface of the flexible substrate 20 can pass through the flexible substrate 20 and can be seen by an observer. In the present embodiment, the flexible substrate 20 further includes a first non-transparent area A2. The first transparent area A1 and the first non-transparent area A2 are sequentially disposed. In the first non-transparent area A2, the structure located on the another surface of the flexible substrate 20 cannot be observed through the flexible substrate 20. That is, in the first non-transparent area A2, the light emitted by the structure located on the another surface of the flexible substrate 20 cannot pass through the flexible substrate 20 to be seen by the observer.

Figure 4:
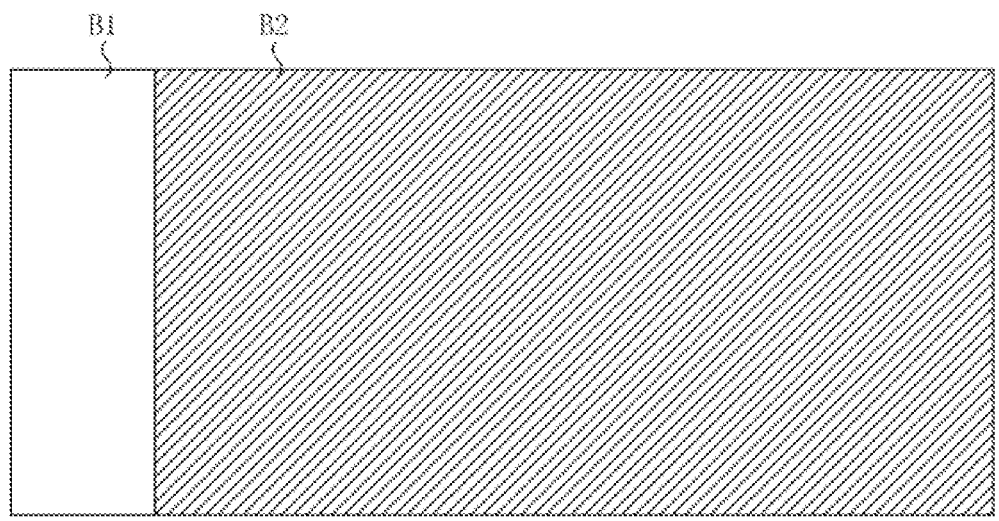
FIG. 4 is a schematic top structural view of a drive layer of the first embodiment of the flexible and foldable OLED display device according to the present invention.

The drive layer 30 has a second transparent area B1. In the second transparent area B1, a structure located on another surface of the drive layer 30 can be observed through the drive layer 30. That is, in the second transparent area B1, light emitted by the structure located on the another surface of the drive layer 30 can pass through the drive layer 30 to be seen by the observer. FIG. 4 is a schematic top structural view of the drive layer 30 of the first embodiment of the flexible and foldable OLED display device according to the present invention. Referring to FIG. 2 and FIG. 4, in the present embodiment, the drive layer 30 further includes a second non-transparent area B2. The second transparent area B1 is disposed on one end of the second non-transparent area B2. In the second non-transparent area B2, the structure located on the another surface of the drive layer 30 cannot be observed through the drive layer 30. That is, in the second non-transparent area B2, the light emitted by the structure located on the another surface of the drive layer 30 cannot pass through the drive layer 30 to be seen by the observer.

In a direction perpendicular to the organic light-emitting layer 40, there is an overlapping area C between an orthographic projection of the first transparent area A1 and an orthographic projection of the second transparent area B1. In details, referring to FIG. 2, in a direction Y, there is the overlapping area C between the orthographic projection of the first transparent area A1 and the orthographic projection of the second transparent area B1. In the present embodiment, the orthographic projection of the first transparent area A1 is partially overlaid with the orthographic projection of the second transparent area B1. In details, an area of the orthographic projection of the first transparent area A1 is greater than an area of the orthographic projection of the second transparent area B1. That is, the orthographic projection of the second transparent area B1 is covered by the orthographic projection of the first transparent area A1. In another embodiment of the present invention, the orthographic projection of the first transparent area A1 and the orthographic projection of the second transparent area B1 completely overlay with each other, that is, the first transparent area A1 is directly facing the second transparent area B1.

On one side of the flexible substrate 20 away from the organic light-emitting layer 40, the overlapping area C functions as a display area. In details, when the flexible and foldable OLED display device is bent inward to form a structure shown in FIG. 3, the organic light-emitting layer 40 is located inside the flexible and foldable OLED display device, and the flexible substrate 20 is located outside the flexible and foldable OLED display device, so that on a side of the flexible substrate 20, in the overlapping area C, information displayed on the organic light-emitting layer 40 in the area can be viewed, inasmuch as the overlapping area C is in the first transparent area A1 of the flexible substrate 20 and the second transparent area B1 of the drive layer 30, so that in the overlapping area C, light from the organic light-emitting layer 40 can pass through the flexible substrate 20 and the drive layer 30 to be seen by the observer; that is, the information displayed on the organic light-emitting layer 40 can be captured by the observer. In the present invention, after the flexible and foldable OLED display device is bent inward, the overlapping area C may be used as a functional area for information display. When being bent inward, the flexible and foldable OLED display device can still display information such as a time and a message, without unfolding the flexible and foldable OLED display device by a user, thereby improving usability of the flexible and foldable OLED display device.

Figure 5:
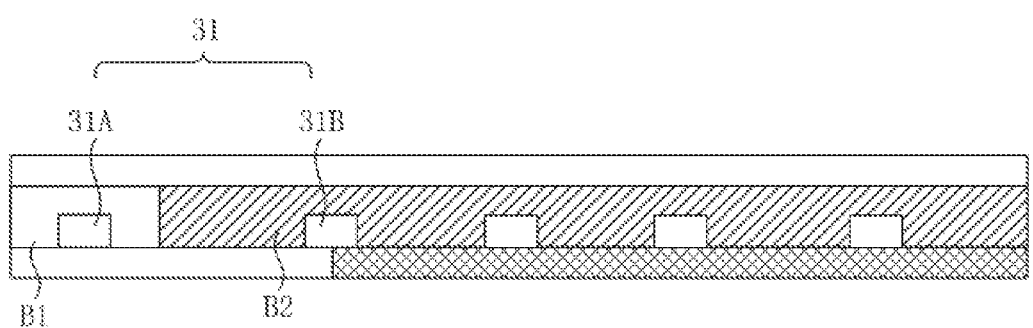
FIG. 5 is a schematic sectional view of the first embodiment of the flexible and foldable OLED display device according to the present invention.

Further, in the present embodiment, the drive layer 30 is a thin film transistor layer. The thin film transistor layer includes a plurality of thin film transistors 31. FIG. 5 is a schematic sectional view of the first embodiment of the flexible and foldable OLED display device according to the present invention. Referring to FIG. 2 and FIG. 5, in details, the second transparent area B1 includes a plurality of thin film transistors 31A, and the second non-transparent area B2 includes a plurality of thin film transistors 31B. FIG. 5 exemplarily shows one thin film transistor 31A and four thin film transistors 31B. The thin film transistor 31 and the organic light-emitting layer 40 both have conventional structures in the art, and details are not described.

A ratio of an area of a drive circuit in the drive layer 30 to an area of the organic light-emitting layer 40 may be changed to design transparency of the drive layer 30. In details, if all the thin film transistors 30 are made of a non-transparent material, that is, the drive circuit in the drive layer is non-transparent, a light output area can be increased by reducing an area of the drive circuit. Therefore, during manufacturing, a ratio of an area of a drive circuit located in the second transparent area B1 to the area of the organic light-emitting layer 40 may be made to be less than a ratio of an area of a drive circuit located in the second non-transparent area B2 to the area of the organic light-emitting layer 40, to form the second transparent area B1 in the drive layer 30.

In addition, structures of different thin film transistors may be configured to design transparency of the drive layer 30. In details, the thin film transistor 31A in the second transparent area B1 and the thin film transistor 31B in the second non-transparent area B2 use different active layer materials. An active layer of the thin film transistor 31A in the second transparent area B1 uses a transparent material such as indium gallium zinc oxide (IGZO) or AZO, and the thin film transistor 31B of the second non-transparent area B2 uses a non-transparent material such as a-Si or LTPS, to form the second transparent area B1 in the drive layer 30.

Figure 6:
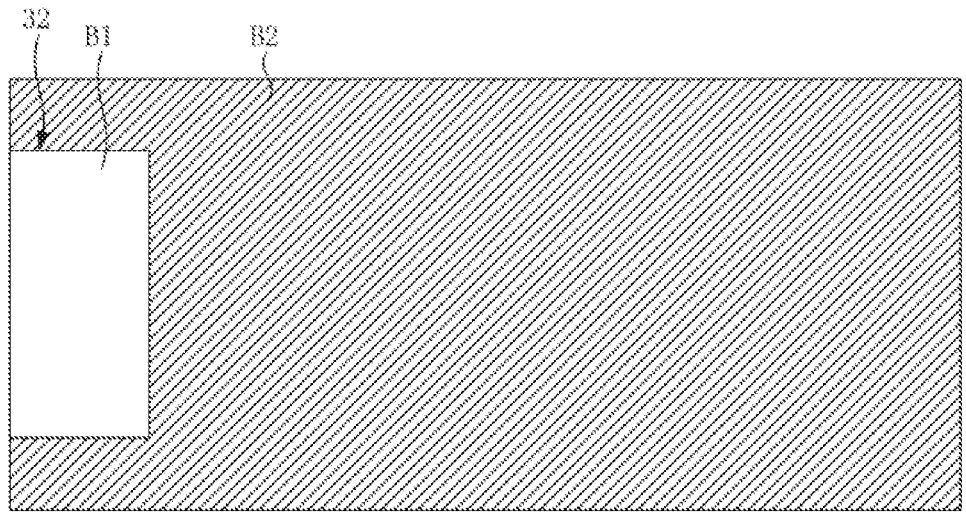
FIG. 6 is a schematic top structural view of a drive layer of a second embodiment of a flexible and foldable OLED display device according to the present invention.

FIG. 6 is a schematic top structural view of a drive layer of a second embodiment of a flexible and foldable OLED display device according to the present invention. Referring to FIG. 6, a difference between the second embodiment and the first embodiment lies in that one end of the second non-transparent area B2 in the drive layer 30 is provided with a groove 32 recessed toward a center of the second non-transparent area B2, and the second transparent area B1 is disposed in the groove 32. That is, the end of the second non-transparent area B2 has a special-shaped structure, and the second transparent area B1 is provided in a gap of the special-shaped structure.

Figure 7:
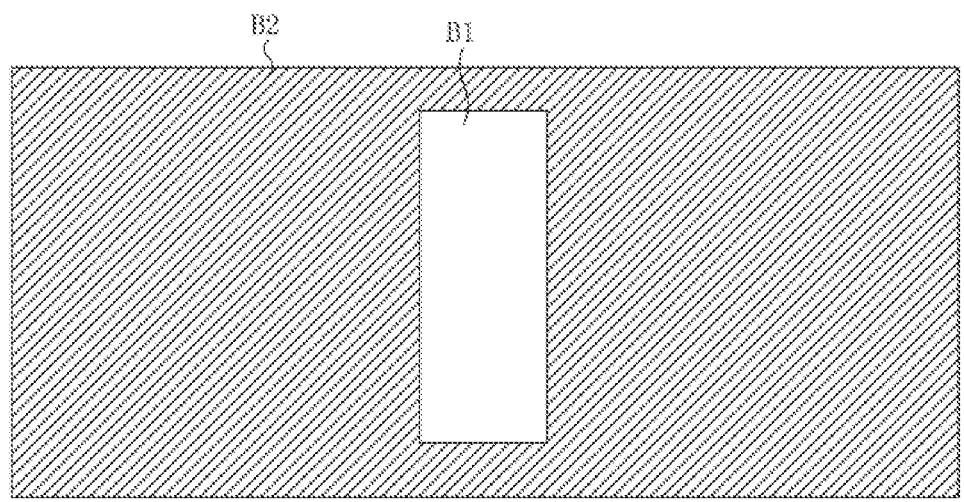
FIG. 7 is a schematic top structural view of a drive layer of a third embodiment of a flexible and foldable OLED display device according to the present invention.

FIG. 7 is a schematic top structural view of a drive layer of a third embodiment of a flexible and foldable OLED display device according to the present invention. Referring to FIG. 7, a difference between the third embodiment and the first embodiment lies in that, the second non-transparent area B2 in the drive layer 30 surrounds the second transparent area B1. That is, the second transparent area B1 is in the middle of the second non-transparent area B2. In the present embodiment, the overlapping area C is disposed corresponding to a bending area of the flexible and foldable OLED display device, thereby to achieve the purpose of being viewed in the bending area.

The foregoing descriptions are merely preferred implementations of the present invention. It should be noted that a person of ordinary skill in the art may make several improvements or refinements without departing from the principle of the present invention, and the improvements or refinements shall fall within the protection scope of the present invention.

The subject matter in the present disclosure can be manufactured and used in the industry and has industrial applicability.

What is claimed is:

1. A flexible and foldable organic light-emitting diode (OLED) display device, comprising:
a flexible substrate, a drive layer, and an organic light-emitting layer, wherein the drive layer is disposed on the flexible substrate, the organic light-emitting layer is disposed on the drive layer, the flexible substrate has a first transparent area, and the drive layer has a second transparent area, wherein an overlapping area is defined between an orthographic projection of the first transparent area and an orthographic projection of the second transparent area in a direction perpendicular to the organic light-emitting layer, the overlapping area on one side of the flexible substrate away from the organic light-emitting layer functions as a display area, and wherein the drive layer further comprises a non-transparent area, a ratio of an area of a drive circuit in the second transparent area to an area of the organic light-emitting layer is less than a ratio of an area of a drive circuit in the non-transparent area to the area of the organic light-emitting layer, one end of the non-transparent area is provided with a groove recessed toward a center of the non-transparent area, and the second transparent area is disposed in the groove.

2. The flexible and foldable OLED display device according to claim 1, wherein the flexible substrate is a transparent flexible substrate.

3. The flexible and foldable OLED display device according to claim 1, wherein the overlapping area is disposed corresponding to a bending area of the flexible and foldable OLED display device.

4. The flexible and foldable OLED display device according to claim 1, wherein the first transparent area and the second transparent area completely overlap with each other.

5. The flexible and foldable OLED display device according to claim 1, wherein the first transparent area partially overlaps the second transparent area.

6. The flexible and foldable OLED display device according to claim 1, wherein the drive layer is a thin film transistor layer comprising a plurality of thin film transistors.

7. A flexible and foldable organic light-emitting diode (OLED) display device, comprising:
a flexible substrate, a drive layer, and an organic light-emitting layer, wherein the drive layer is disposed on the flexible substrate, the organic light-emitting layer is disposed on the drive layer, wherein the flexible substrate has a first transparent area, the drive layer has a second transparent area, an overlapping area is defined between an orthographic projection of the first transparent area and an orthographic projection of the second transparent area in a direction perpendicular to the organic light-emitting layer, and the overlapping area on one side of the flexible substrate away from the organic light-emitting layer functions as a display area;
wherein the drive layer further comprises a non-transparent area, and the second transparent area is disposed on one end of the non-transparent area.

8. The flexible and foldable OLED display device according to claim 7, wherein the flexible substrate is a transparent flexible substrate.

9. The flexible and foldable OLED display device according to claim 7, wherein one end of the non-transparent area is provided with a groove recessed toward a center of the non-transparent area, and the second transparent area is disposed in the groove.

10. The flexible and foldable OLED display device according to claim 7, wherein a ratio of an area of a drive circuit in the second transparent area to an area of the organic light-emitting layer is less than a ratio of an area of a drive circuit in the non-transparent area to the area of the organic light-emitting layer.

11. The flexible and foldable OLED display device according to claim 7, wherein the overlapping area is disposed corresponding to a bending area of the flexible and foldable OLED display device.

12. The flexible and foldable OLED display device according to claim 7, wherein the first transparent area and the second transparent are a completely overlap with each other.

13. The flexible and foldable OLED display device according to claim 7, wherein the first transparent area partially overlaps the second transparent area.

14. The flexible and foldable OLED display device according to claim 7, wherein the drive layer is a thin film transistor layer comprising a plurality of thin film transistors.

15. A flexible and foldable organic light-emitting diode (OLED) display device, comprising:
a flexible substrate, a drive layer, and an organic light-emitting layer, wherein the drive layer is disposed on the flexible substrate, the organic light-emitting layer is disposed on the drive layer, wherein the flexible substrate has a first transparent area, the drive layer has a second transparent area, an overlapping area is defined between an orthographic projection of the first transparent area and an orthographic projection of the second transparent area in a direction perpendicular to the organic light-emitting layer, and the overlapping area on one side of the flexible substrate away from the organic light-emitting layer functions as a display area;
wherein the drive layer further comprises a non-transparent area, and the non-transparent area surrounds the second transparent area.

16. The flexible and foldable OLED display device according to claim 15, wherein a ratio of an area of a drive circuit in the second transparent area to an area of the organic light-emitting layer is less than a ratio of an area of a drive circuit in the non-transparent area to the area of the organic light-emitting layer.

* * * * *

UNITED STATES PATENT AND TRADEMARK OFFICE
CERTIFICATE OF CORRECTION

PATENT NO. : 10,897,020 B2  
APPLICATION NO. : 16/603259  
DATED : January 19, 2021  
INVENTOR(S) : Lei Wang et al.

Page 1 of 1

It is certified that error appears in the above-identified patent and that said Letters Patent is hereby corrected as shown below:

On the Title Page

Insert the following:
-- **(30) *Foreign Application Priority Data***
Dec. 13, 2018 (CN)................... 201811527313.7 --

Signed and Sealed this  
Sixth Day of April, 2021

Drew Hirshfeld  
*Performing the Functions and Duties of the*  
*Under Secretary of Commerce for Intellectual Property and*  
*Director of the United States Patent and Trademark Office*